No. 11,865. Reissued Oct. 23, 1900.
N. TESLA.
METHOD OF INSULATING ELECTRIC CONDUCTORS.
(Application filed Sept. 21, 1900.)
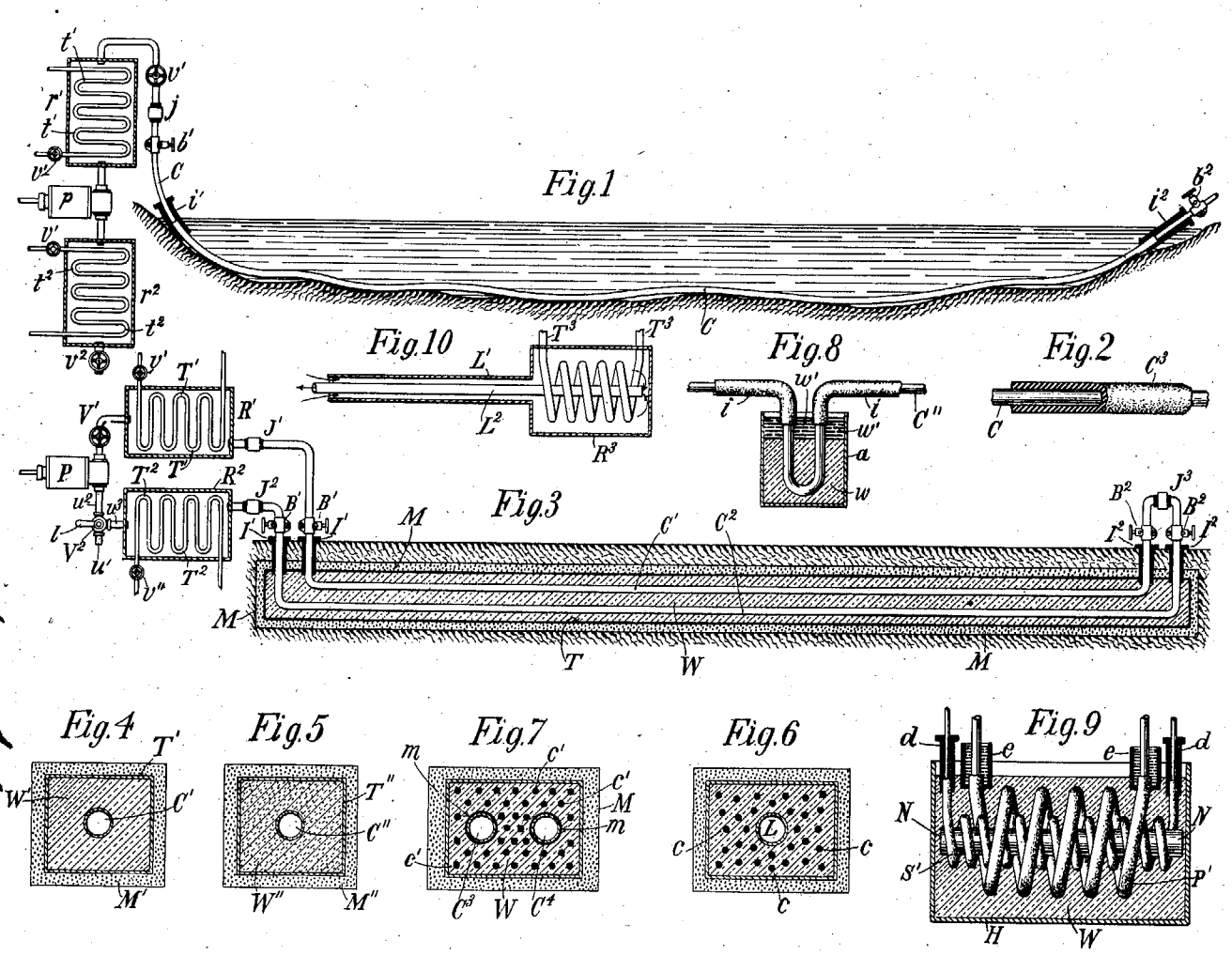
Witnesses:
Raphael Pitts
Benjamin Miller
Nikola Tesla Inventor
by Kerr Page & Cooper Att'ys.

UNITED STATES PATENT OFFICE.

NIKOLA TESLA, OF NEW YORK, N. Y.

METHOD OF INSULATING ELECTRIC CONDUCTORS.

SPECIFICATION forming part of Reissued Letters Patent No. 11,865 dated October 23, 1900.

Original No. 655,838, dated August 14, 1900. Application for reissue filed September 21, 1900. Serial No. 30,722.

*To all whom it may concern:*

Be it known that I, NIKOLA TESLA, a citizen of the United States, residing in the borough of Manhattan, in the city, county, and State of New York, have invented certain new and useful Improvements in Methods of Insulating Electric Conductors, of which the following is a specification, reference being had to the accompanying drawings.

It has long been known that many substances which are more or less conducting when in the fluid condition become insulators when solidified. Thus water, which is in a measure conducting, acquires insulating properties when converted into ice. The existing information on this subject, however, has been heretofore of a general nature only and chiefly derived from the original observations of Faraday, who estimated that the substances upon which he experimented, such as water and aqueous solutions, insulate an electrically-charged conductor about one hundred times better when rendered solid by freezing, and no attempt has been made to improve the quality of the insulation obtained by this means or to practically utilize it for such purposes as are contemplated in my present invention. In the course of my own investigations, more especially those of the electric properties of ice, I have discovered some novel and important facts, of which the more prominent are the following: first, that under certain conditions, when the leakage of the electric charge ordinarily taking place is rigorously prevented, ice proves itself to be a much better insulator than has heretofore appeared; second, that its insulating properties may be still further improved by the addition of other bodies to the water; third, that the dielectric strength of ice or other frozen aqueous substance increases with the reduction of temperature and corresponding increase of hardness, and, fourth, that these bodies afford a still more effective insulation for conductors carrying intermittent or alternating currents, particularly of high rates, surprisingly-thin layers of ice being capable of withstanding electromotive forces of many hundreds and even thousands of volts. These and other observations have led me to the invention of a novel method of insulating conductors, rendered practicable by reason of the above facts and advantageous in the utilization of electrical energy for industrial and commercial purposes.

This method consists in insulating an electric conductor by freezing or solidifying and maintaining in such state the material surrounding or contiguous to the conductor, using for the purpose a gaseous cooling agent circulating through one or more suitable channels extending through or in proximity to the said material.

In the practical carrying out of my method I may employ a hollow conductor and pass the cooling agent through the same, thus freezing the water or other medium in contact with or close to such conductor, or I may use expressly for the circulation of the cooling agent an independent channel and freeze or solidify the adjacent substance in which any number of conductors may be embedded. The conductors may be bare or covered with some material which is capable of keeping them insulated when it is frozen or solidified. The frozen mass may be in direct touch with the surrounding medium, or it may be in a degree protected from contact with the same by an inclosure more or less impervious to heat. The cooling agent may be any kind of gas, as atmospheric air, oxygen, carbonic acid, ammonia, illuminating-gas, or hydrogen. It may be forced through the channel by pressure or suction produced mechanically or otherwise. It may be continually renewed or indefinitely used, being driven back and forth or steadily circulated in closed paths under any suitable conditions as regards pressure, density, temperature, and velocity.

To conduce to a better understanding of the invention, reference is now made to the accompanying drawings, in which—

Figures 1, 3, 6, 7, 8, and 9 illustrate in longitudinal section typical ways of carrying out my invention; and Figs. 2, 4, 5, and 10, in section, or partly so, constructive details to be described.

In Fig. 1, C is a hollow conductor, such as a steel tube, laid in a body of water and communicating with a reservoir $r'$, but electrically insulated from the same at $j$. A pump or compressor $p$, of any suitable construction, connects $r'$ with another similar tank $r^2$, provided with an inlet-valve $v^3$ The air or other gas which is used as the cooling agent entering through the valve $v^2$ is drawn through the tank $r^2$ and pump $p$ into the reservoir $r'$, escaping thence through the conductor C under any desired pressure which may be regulated by a valve $v'$. Both the reservoirs $r'$ and $r^2$ are kept at a low temperature by suitable means, as by coils or tubes $t'$ $t'$ and $t^2$ $t^2$, through which any kind of refrigerating fluid may be circulated, some provision being preferably made for adjusting the flow of the same, as by valves $v'$. The gas continuously passing through the tube or conductor C being very cold will freeze and maintain in this state the water in contact with or adjacent to the conductor and so insulate it. Flanged bushings $i'$ $i^2$, of non-conducting material, may be used to prevent the leakage of the current which would otherwise occur, owing to the formation of a superficial film of moisture over the ice projecting out of the water. The tube being kept insulated by this means may then be employed in the manner of an ordinary telegraphic or other cable by connecting either or both of the terminals $b'$ $b^2$ in a circuit including the earth.

In many cases it will be of advantage to cover the hollow conductor with a thick layer of some cheap material, as felt, this being indicated by $C^3$ in Fig. 2. Such a covering, penetrable by water, would be ordinarily of little or no use; but when embedded in the ice it improves the insulating qualities of the same. In this instance it furthermore serves to greatly reduce the quantity of ice required, its rate of melting, and the influx of heat from the outside, thus diminishing the expenditure of energy necessary for the maintenance of normal working conditions. As regards this energy and other particulars of importance they will vary according to the special demands in each case.

Generally considered, the cooling agent will have to carry away heat at a rate sufficient to keep the conductor at the desired temperature and to maintain a layer of the required thickness of the substance surrounding it in a frozen state, compensating continually for the heat flowing in through the layer and wall of the conductor and that generated by mechanical and electrical friction. To meet these conditions, its cooling capacity, which is dependent on the temperature, density, velocity, and specific heat, will be calculated by the help of data and formulæ familiar to engineers. Air will be, as a rule, suitable for the use contemplated; but in exceptional instances some other gas, as hydrogen, may be resorted to, which will permit a much greater rate of cooling and a lower temperature to be reached. Obviously whichever gas be employed it should before entering the hollow conductor or channel be thoroughly dried and separated from all which by condensation and deposition or otherwise might cause an obstruction to its passage. For these purposes apparatus may be employed which is well known and which it is unnecessary to show in detail.

Instead of being wasted at the distant station the cooling agent may be turned to some profitable use. Evidently in the industrial and commercial exploitation of my invention any kind of cooling agent capable of meeting the requirements may be conveyed from one to another station and there utilized for refrigeration, power, heating, lighting, sanitation, chemical processes, or any other purpose to which it may lend itself, and thus the revenue of the plant may be increased.

As to the temperature of the conductor, it will be determined by the nature of its use and considerations of economy. For instance, if it be employed for the transmission of telegraphic messages, when the loss in electrical friction may be of no consequence, a very low temperature may not be required; but if it be used for transmitting large amounts of electrical energy, when the frictional waste may be a serious drawback, it will be desirable to keep it extremely cold. The attainment of this object will be facilitated by any provision for reducing as much as possible the flowing in of the heat from the surrounding medium. Clearly the lower the temperature of the conductor the smaller will be the loss in electrical friction; but, on the other hand, the colder the conductor the greater will be the influx of heat from the outside and the cost of cooling agent. From such and similar considerations the temperature securing the highest economy will be ascertained.

Most frequently in the distribution of electricity for industrial purposes, as in my system of power transmission by alternate currents, more than one conductor will be required, and in such cases it may be convenient to circulate the cooling agent in a closed path formed by the conductors A plan of this kind is illustrated in Fig. 3, in which C' and $C^2$ represent two hollow conductors embedded in a frozen mass underground and communicating, respectively, with the reservoirs R' and $R^2$, which are connected by a reciprocating or other suitable pump P. Cooling coils or tubes T' T' and $T^2$ $T^2$, with regulating-valves $v'$ $v^2$ are employed, which are similar to and serve the same purpose as those shown in Fig. 1. Other features of similarity, though unnecessary, are illustrated to facilitate an understanding of the plan. A three-way valve $V^2$ is provided, which when placed with its lever 1 as indicated allows the cooling agent to enter through the tubes $u'$ $u^2$ and pump P, thus filling the reservoirs R' $R^2$ and hollow conductors C' $C^2$; but when turned ninety degrees the valve shuts off the communication to the outside through the tube $u'$ and establishes a connection between the reservoir $R^2$ and pump P through the tubes $u^2$ and $u^3$, thus permitting the cooling agent to be circulated in the closed path C' $C^2$ $R^2$ $u^3$ $u^2$ P R' by the action of the pump. Another valve V′, of suitable construction, may be used for regulating the flow of the cooling agent. The conductors C′ $C^2$ are insulated from the reservoirs R′ $R^2$ and from each other at the joints J′ $J^2$ $J^3$, and they are furthermore protected at the places where they enter and leave the ground by flanged bushings I′ I′ $I^2$ $I^2$, of insulating material, which extend into the frozen mass in order to prevent the current from leaking, as above explained. Binding-posts B′ B′ and $B^2$ $B^2$ are provided for connecting the conductors to the circuit at each station.

In laying the conductors, as C′ $C^2$, whatever be their number, a trench will generally be dug and a trough, round or square, as T, of smaller dimensions than the trench, placed in the same, the intervening space being packed with some material (designated by M M M) more or less impervious to heat, as sawdust, ashes, or the like. Next the conductors will be put in position and temporarily supported in any convenient manner, and, finally, the trough will be filled with water or other substance W, which will be gradually frozen by circulating the cooling agent in the closed path, as before described. Usually the trench will not be level, but will follow the undulations of the ground, and this will make it necessary to subdivide the trough in sections or to effect the freezing of the substance filling it successively in parts. This being done and the conductors thus insulated and fixed, a layer of the same or similar material M M M will be placed on the top and the whole covered with earth or pavement. The trough may be of metal, as sheet-iron, and in cases where the ground is used as the return-circuit it may serve as a main, or it may be of any kind of material more or less insulating. Figs. 4 and 5 illustrate in cross-section two such underground troughs T′ and T″, of sheet metal, with their adiathermanous inclosures, (designated M′ and M″, respectively,) each trough containing a single central hollow conductor, as C′ C″. In the first case the insulation W′ is supposed to be ice obtained by freezing water preferably freed of air in order to exclude the formation of dangerous bubbles or cavities, while in the second case the frozen mass W″ is some aqueous or other substance or mixture highly insulating when in this condition.

It should be stated that in many instances it may be practicable to dispense with a trough by resorting to simple expedients in the placing and insulating of the conductors. In fact, for some purposes it may be sufficient to simply cover the latter with a moist mass, as cement or other plastic material, which so long as it is kept at a very low temperature and frozen hard will afford adequate insulation.

Another typical way of carrying out my invention, to which reference has already been made, is shown in Fig. 6, which represents the cross-section of a trough, the same in other respects as those before shown, but containing instead of a hollow conductor any kind of pipe or conduit L. The cooling agent may be driven in any convenient manner through the pipe for the purpose of freezing the water or other substance filling the trough, thus insulating and fixing a number of conductors *c c c*. Such a plan may be particularly suitable in cities for insulating and fixing telegraph and telephone wires or the like. In such cases an exceedingly-low temperature of the cooling agent may not be required, and the insulation will be obtained at the expense of little power. The conduit L may, however, be used simultaneously for conveying and distributing any kind of gaseous cooling agent for which there is a demand through the district. Obviously two such conduits may be provided and used in a similar manner as the conductors C′ $C^2$.

It will often be desirable to place in the same trough a great number of wires or conductors serving for a variety of purposes. In such a case a plan may be adopted which is illustrated in Fig. 7, showing a trough similar to that in Fig. 6 with the conductors in cross-section. The cooling agent may be in this instance circulated, as in Fig. 3 or otherwise, through the two hollow conductors $C^3$ and $C^4$, which if found advantageous may be covered with a layer of cheap material *m m*, such as will improve their insulation, but not prevent the freezing or solidification of the surrounding substance W. The tubular conductors C′ $C^2$, preferably of iron, may then serve to convey heavy currents for supplying light and power, while the small ones *c′ c′ c′*, embedded in the ice or frozen mass, may be used for any other purposes.

While my invention contemplates, chiefly, the insulation of conductors employed in the transmission of electrical energy to a distance, it may be, obviously, otherwise usefully applied. In some instances, for example, it may be desirable to insulate and support a conductor in places as is ordinarily done by means of glass or porcelain insulators. This may be effected in many ways by conveying a cooling agent either through the conductor or through an independent channel and freezing or solidifying any kind of substance, thus enabling it to serve the purpose. Such an artificial insulating-support is illustrated in Fig. 8, in which *a* represents a vessel filled with water or other substance *w*, frozen by the agent circulating through the hollow conductor C″, which is thus insulated and supported. To improve the insulation on the top, where it is most liable to give way, a layer of some substance *w′*, as oil, may be used, and the conductor may be covered near the support with insulation *i i*, as shown, the same extending into the oil, for reasons well understood.

Another typical application of my invention is shown in Fig. 9, in which P′ and S′ represent, respectively, the primary and secondary conductors, bare or insulated, of a transformer, which are wound on a core N and immersed in water or other substance W, contained in a jar H, and, as before stated, preferably freed of air by boiling or otherwise. The cooling agent is circulated in any convenient manner, as through the hollow primary P′, for the purpose of freezing the substance W. Flanged bushings *d d* and oil-cups *e e*, extending into the frozen mass, illustrate suitable means for insulating the ends of the two conductors and preventing the leakage of the currents. A transformer as described is especially fitted for use with currents of high frequency when a low temperature of the conductors is particularly desirable, and ice affords an exceptionally-effective insulation.

It will be understood that my invention may be applied in many other ways, that the special means here described will be greatly varied according to the necessities, and that in each case many expedients will be adopted which are well known to engineers and electricians and on which it is unnecessary to dwell. However, it may be useful to state that in some instances a special provision will have to be made for effecting a uniform cooling of the substance surrounding the conductor throughout its length. Assuming in Fig. 1 the cooling agent to escape at the distant end freely into the atmosphere or into a reservoir maintained at low pressure, it will in passing through the hollow conductor C move with a velocity steadily increasing toward the end, expanding isothermally, or nearly so, and hence it will cause an approximately-uniform formation of ice along the conductor. In the plan illustrated in Fig. 3 a similar result will be in a measure attained, owing to the compensating effect of the hollow conductor C′ and $C^2$, which may be still further enhanced by reversing periodically the direction of the flow in any convenient manner; but in many cases special arrangements will have to be employed to render the cooling more or less uniform. For instance, referring to Figs. 4, 5, and 6, instead of a single channel two concentric channels L′ and $L^2$ may be provided and the cooling agent passed through one and returned through the other, as indicated, diagrammatically, in Fig. 10. In this and any similar arrangement when the flow takes place in opposite directions the object aimed at will be more completely attained by reducing the temperature of the circulating cooling agent at the distant station, which may be done by simply expanding it into a large reservoir, as $R^3$, or cooling it by means of a tube or coil $T^3$ or otherwise. Evidently in the case illustrated the concentric tubes may be used as independent conductors if insulated from each other and from the ground by the frozen or solidified substance.

Generally in the transmission of electrical energy in large amounts, when the quantity of heat to be carried off may be considerable, refrigerating apparatus thoroughly protected against the inflow of heat from the outside, as usual, will be employed at both the stations and when the distance between them is very great also at intermediate points, the machinery being advantageously operated by the currents transmitted or cooling agent conveyed. In such cases a fairly-uniform freezing of the insulating substance will be attained without difficulty by the compensating effect of the oppositely-circulating cooling agents. In large plants of this kind when the saving of electrical energy in the transmission is the most important consideration or when the chief object is to reduce the cost of the mains by the employment of cheap metal, as iron or otherwise, every effort will be made to maintain the conductors at the lowest possible temperature, and well-known refrigerating processes, as those based on the regenerative principle, may be resorted to, and in this and any other case the hollow conductors or channels instead of merely serving the purpose of conveying the cooling agent may themselves form active parts of the refrigerating apparatus.

From the above description it will be readily seen that my invention forms a fundamental departure in the principle from the established methods of insulating conductors employed in the industrial and commercial application of electricity. It aims, broadly, at obtaining insulation by the continuous expenditure of a moderate amount of energy instead of securing it only by virtue of an inherent physical property of the material used as heretofore. More especially, its object is to provide, when and wherever required, insulation of high quality, of any desired thickness, and exceptionally cheap, and to enable the transmission of electrical energy under conditions of economy heretofore unattainable and at distances until now impracticable by dispensing with the necessity of using costly conductors and insulators.

What I claim as my invention is—

1. The method of insulating electric conductors herein described which consists in imparting insulating properties to material surrounding or contiguous to the said conductor by the continued action thereon of a gaseous cooling agent, as set forth.

2. The method of insulating electric conductors herein described which consists in reducing to and maintaining in a frozen or solidified condition the material surrounding or contiguous to the said conductor by the action thereon of a gaseous cooling agent maintained in circulation through one or more channels as set forth.

3. The method of insulating electric conductors herein described which consists in surrounding or supporting the conductor by material which acquires insulating properties when in a frozen or solidified state, and maintaining the material in such a state by the circulation through one or more channels extending through it of a gaseous cooling agent, as set forth.

4. The method of insulating an electric conductor which consists in surrounding or supporting said conductor by a material which acquires insulating properties when frozen or solidified, and maintaining the material in such state by passing a gaseous cooling agent continuously through a channel in said conductor, as set forth.

5. The method of insulating electric conductors, which consists in surrounding or supporting the said conductors by a material which acquires insulating properties when in a frozen or solidified state, and maintaining the material in such state by the continued application thereto of a gaseous cooling agent, as set forth.

6. The method of insulating conductors herein set forth which consists in surrounding or supporting the conductors by a material which acquires insulating properties when in a frozen or solidified state, and maintaining the material in such state by the circulation of a gaseous cooling agent through a circuit of pipes or tubes extending through the said material as set forth.

7. The method of insulating electric conductors which consists in laying or supporting the conductors in a trough or conduit filling the trough with a material which acquires insulating properties when frozen or solidified, and then causing a gaseous cooling agent to circulate through one or more channels extending through the material in the trough so as to freeze or solidify the material, as set forth.

8. The method of insulating electric conductors which consists in embedding the same in a moist or plastic compound which acquires insulating properties when in a frozen or solidified state, and maintaining the compound in such state by circulating a gaseous cooling agent through one or more channels extending through the compound, as set forth.

9. The method of insulating electric conductors which consists in laying or supporting the conductors in a trough or conduit, filling the trough with a material which acquires insulating properties when frozen or solidified, protecting the trough from the surrounding medium in which it is laid by an adiathermanous inclosure, and then freezing or solidifying the material surrounding the conductors and maintaining the same in such state by circulating a gaseous cooling agent through one or more channels extending through the same, as set forth.

NIKOLA TESLA.

Witnesses:
DRURY W. COOPER,
JOHN C. KERR.